United States Patent [19]

Okai et al.

[11] 4,164,422

[45] Aug. 14, 1979

[54] WATER DEVELOPABLE, PHOTOPOLYMER PRINTING PLATES HAVING INK-REPULSIVE NON-IMAGE AREAS

[75] Inventors: Sakuo Okai, Carlsbad; Koichi Kimoto, Oceanside, both of Calif.

[73] Assignee: Napp Systems (USA), Inc., San Marcos, Calif.

[21] Appl. No.: 834,086

[22] Filed: Sep. 19, 1977

[51] Int. Cl.² .................. G03C 1/76; G03C 1/94; G03F 7/02
[52] U.S. Cl. .................................... 96/67; 96/33; 96/35.1; 96/86 P
[58] Field of Search ............... 96/86 P, 67, 33, 35.1

[56] References Cited

U.S. PATENT DOCUMENTS

| 3,511,178 | 5/1970 | Curtin | 96/86 P |
|---|---|---|---|
| 3,615,538 | 10/1971 | Peters | 96/75 |
| 3,632,375 | 1/1972 | Gipe | 96/86 |
| 3,677,178 | 7/1972 | Gipe | 96/33 |
| 3,728,123 | 4/1973 | Gipe | 96/33 |
| 3,758,306 | 9/1973 | Roos | 96/83 |
| 3,869,285 | 3/1975 | Kondo | 96/33 |
| 3,886,865 | 6/1975 | Ohto | 96/86 P |
| 3,890,149 | 6/1975 | Schlesinger | 96/86 P |
| 3,894,873 | 7/1975 | Kobayashi et al. | 96/86 P |
| 3,911,169 | 10/1975 | Lesaicherre | 96/35.1 |
| 3,945,830 | 3/1976 | Yazawa | 96/33 |
| 3,949,142 | 4/1976 | Doggett | 96/33 |
| 3,953,212 | 4/1976 | Miyano | 96/33 |
| 3,975,352 | 8/1976 | Yoerger | 96/33 |
| 4,086,093 | 4/1978 | Ezumi et al. | 96/86 P |

Primary Examiner—Mary F. Kelley
Attorney, Agent, or Firm—Raymond P. Niro

[57] ABSTRACT

Letterpress and offset photopolymer printing plates are disclosed having relatively thin water developable photopolymer layers, which, after being developed, have ink-repulsive, non-image areas. Adhesive layers are provided in the disclosed printing plates that are interposed between an ink-repulsive coating contained in the printing plate substrate and the water-developable photopolymer, and provide a balance between satisfactory adhesive and ink-repulsive properties in the resulting plate.

7 Claims, No Drawings

WATER DEVELOPABLE, PHOTOPOLYMER PRINTING PLATES HAVING INK-REPULSIVE NON-IMAGE AREAS

BACKGROUND OF THE INVENTION

The present invention relates generally to photopolymerized printing plates useful in both letterpress and offset lithography printing processes. More particularly, the present invention concerns water developable photopolymer printing plates which include (a) a support substrate coated with an ink-repulsive layer, and (b) a uniquely formulated adhesive layer which joins separate ink-repulsive and water-soluble photopolymer layers in such a manner as to provide a desired balance between the ink-repulsive and adhesive properties of the resultant printing plate.

In recent years, water-developable photopolymer printing plates have been widely and quite successfully used in various relief printing processes, especially in the newspaper industry, as a consequence of the many practical advantages that water-developable printing plates offer over solvent-developable printing plates. It has long been recognized, for example, that photopolymer printing plates that are developable with organic solvents or aqueous alkaline solutions present a myriad of environmental and plate processing problems that can be readily overcome through the use of water-developable photopolymers.

Yet, despite the widespread acceptance of relief-type, water-developable photopolymer plates, such plates have in the past suffered from the disadvantage of requiring relatively thick photopolymer layers, and, thus, being relatively expensive, when compared, for example, to printing plates that are conventionally used in stereotype systems employed by some large newspapers. A need has arisen, therefore, for less expensive water-developable printing plates, which at least in part can be satisfied through the use of shallow relief photopolymer printing plates.

Such shallow relief photopolymer plates are capable of providing acceptable printing quality with photopolymer layers having greatly reduced thicknesses. This is accomplished through the use of relatively thin photopolymer layers that have raised image or relief areas and recessed background (non-image) areas that include an array of small protuberances. The use of background areas containing the array of protuberances has been found, for example, to prevent bottoming from occurring during the printing process, thereby enabling the use of substantially thinner photopolymer layers which, in turn, results in a substantial reduction in the cost of manufacturing such plates.

While shallow-relief photopolymer plates have overcome many of the problems of utilizing water-developable plates in letterpress printing processes, it has also been found that water-developable plates can be successfully used in offset lithographic printing processes, through the use of unique unilayer film structures having a generally continuous minor phase, e.g., a photosensitive material that changes solubility relative to a selected solvent upon exposure to light, and a generally discontinuous major phase, e.g., a particulate material which is neither photosensitive nor soluble in the solvent. Such unilayer photosensitive film structures, which are described in greater detail in co-pending application Ser. No. 815,899, filed July 15, 1977, can be made selectively permeable to fluids upon exposure to light and can provide lithographic printing plates in which ink receptivity and durability of the imaging areas are relatively independent of the exposure technique and developing composition used in making a finished plate.

It is, of course, desirable in both letterpress and offset lithography printing that printing plates utilized in such processes, at least in some cases, have non-image areas that are ink-repulsive. In the case of letterpress plates, the use of ink-repulsive, non-image background areas permits the use of relatively thick photopolymer layers, without the need for background areas containing an array of small protuberances. In addition, the incorporation of ink-repulsive, non-image background areas in letterpress plates not only allows such plates to be used in color printing, but reduces the possibility of obtaining undesired dark background areas during printing, which can sometimes occur when shallow-relief plates of the type described above are used.

Similarly, in the case of offset printing plates, the use of photopolymer plates having ink-repulsive, non-image areas eliminates the need for water as the vehicle to resist deposits of ink in the non-image areas, which, in turn, eliminates the many problems, such as paper waste, and the development of special inks, papers and rollers, that are commonly associated with offset lithography printing.

Heretofore, one of the major obstacles to the use of water-developable photopolymer printing plates having ink-repulsive, non-image areas has occurred as a direct result of the difficulties experienced in obtaining strong adhesion between the water-developable photopolymer layer and the ink-repulsive coatings contained on such printing plate substrates. When the water-developable photopolymer layer was coated directly onto the ink-repulsive layer, for example, poor adhesion often resulted. And, when intermediate adhesive layers were interposed between the photopolymer and ink-repulsive layers, strong adhesion, but poor ink-repulsive properties resulted.

A need has arisen, therefore, for suitable adhesive compositions, useful in both water-developable letterpress and offset printing plates that can provide a balance between highly desirable ink-repulsive properties and satisfactory adhesion between the separate ink-repulsive and photopolymer layers of such printing plates.

SUMMARY OF THE INVENTION

Accordingly, the present invention is generally directed to water-developable photopolymer printing plates which include photopolymer image areas and ink-repulsive, non-image areas. Adhesive layers, which provide a unique balance between adhesive and ink-repulsive properties, are provided to join the water-developable photopolymer with an ink-repulsive coating contained on the printing plate substrate.

In addition, combinations of two separate ink-repulsive layers are provided by the present invention, a first layer, comprising a highly ink-repulsive silicon rubber or equivalent composition, which covers the printing plate substrate, and a second adhesive layer that has both ink-repulsive and adhesive properties, comprising silicon rubber, selected groups of water soluble resins and controlled amounts of the water-developable photosensitive polymer used in the photopolymer layer, which joins the first ink-repulsive layer and the photopolymer layer.

DETAILED DESCRIPTION OF VARIOUS EMBODIMENTS OF THE INVENTION

The photopolymer printing plates of the present invention offer a number of advantages over many known photopolymer printing plates in that they utilize water-developable photopolymers, and, thus, avoid the necessity of employing costly and sometimes dangerous developing solvents. They result in the preparation of plates that require relatively thin layers of photopolymer, without sacrificing printing quality. They result in the preparation of printing plates that have ink-repulsive, non-image areas, and, thus, are particularly suited for use in letterpress and offset lithography printing. They include uniquely formulated ink-repulsive layers which have the capability of providing both strong adhesion between ink-repulsive coatings contained on the plate substrate and the water developable photopolymer. When used in offset lithography, they eliminate the need for water in the printing process, and, thus, reduce the cost, complexity and amount of paper wasted in conventional offset printing. And, when used in letterpress printing, they eliminate the need for an array of small protuberances in the non-image background areas, and yet still provide high quality printing with relatively low thickness photopolymer layers.

The photopolymer plates of the present invention generally include the following elements: (a) a support substrate, (b) an ink-repulsive coating contained on the support substrate, (c) a water-developable photopolymer layer, and (d) an ink-repulsive adhesive layer which advantageously joins the photopolymer and ink-repulsive layers in a manner that imparts both satisfactory adhesion and acceptable ink-repulsive characteristics to the resultant printing plate.

Although any suitable support substrate material can be used in the practice of the present invention, it has been found that satisfactory results can be achieved with metal substrates, such as aluminum or steel, or polyester or related polymeric substrates, indeed, even with paper substrates in some instances. Preferably the photopolymers used in the practice of the present invention are water-developable. In the case of letterpress plates, the photopolymer compositions found particularly useful are those which include: (a) at least one unsaturated ethylenic monomer, preferably having a boiling point about 100° C., molecular weight below 1500 and 1 to 4 polymerizable ethylenic groups, and being polymerizable by actinic light in the presence of a photopolymerization initiator; (b) a photopolymerization initiator; and (c) a partially saponified polyvinyl acetate, namely a polymer having both acetyl groups and hydroxy groups produced by saponification or by hydrolysis of polyvinyl acetate and the like and being water-soluble and compatible with the monomer component of (a). The partially saponified polyvinyl acetate used in the photopolymer composition described above preferably has an average degree of polymerization of 300 to 2000 and a saponification degree of 65 to 99 mole percent. If a suitable partially saponified polyvinyl acetate cannot be obtained by saponifying polyvinyl acetate having a low saponification degree as a homopolymer, a copolymer obtained, for example, by copolymerizing vinyl acetate with maleic anhydride can be partially saponified to give the desired polymer. Saponification as used herein is intended to mean the conversion of ester groups or the like into hydroxy groups and the saponification degree represents the extent to which ester groups or the like have been converted to hydroxy groups. Degree of polymerization, as used herein, is intended to represent the molecular weight and viscosity of the polymer, as indicated in Davidson and Sittig, *Water-Soluble Resins* (1962) at page 89.

Such water-developable photopolymer compositions are described in far greater detail in U.S. Pat. Nos. 3,801,328 and 3,877,939, the disclosures of which are incorporated herein by reference.

In the case of offset plates, the photopolymer compositions found particularly useful are those which include a minor phase material uniformly interdispersed with a major phase material; the minor phase being photosensitive, generally continuous through the structure and capable of changing solubility with respect to a given solvent, and the major phase being a discrete particulate material which is not photosensitive and is chosen to be relatively insoluble in the solvent for the minor phase.

Among the photosensitive materials useful as the minor phase in such compositions are any photosensitive compound wherein exposure to electromagnetic radiation creates a change in solubility characteristics in a selected solvent, including, for example, aromatic diazo compounds, light sensitive dyestuffs, azo compounds, dichromates, photopolymers, and silver halide gelatin systems, and particularly condensation products of aldehyde compounds, such as formaldehyde or paraformaldehyde, and a diazo compound such as 4-diazo-1,1'-diphenylamine.

Included among the homopolymers and copolymers, in emulsion-dispersion form, which are suitable for use as the major phase in such compositions are: acrylics, copolymers of acetate and ethylene, copolymers of styrene and acrylates, polyvinyl acetates, and copolymers of vinyl acetate and acrylates. Each of these may be used with or without protective colloids, wetting agents, plasticizers and other modifying agents.

Such water-developable photopolymer compositions are described in greater detail in United States Application Ser. No. 815,899, filed July 15, 1977, the disclosure of which is likewise incorporated herein by reference.

As noted above, a separate ink-repulsive layer is desirably coated onto the support substrate to provide ink-repulsive properties for the non-imaged areas of the developed plate. Although a number of ink-repulsive compositions can be used in the practice of the present invention, commercially available silicon rubber or silicon oils are preferably used. Such silicon rubbers or oils typically comprised polysiloxane compositions that are generally characterized by the presence of the following repeating unit in their polymeric structural chain:

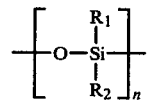

wherein $R_1$ and $R_2$, which may be the same or different, represent hydrogen, an alkyl group, halogen, phenyl or a halogenated alkyl. Representative of the preferred polysiloxane compositions useful in the practice of the present invention are those provided commercially by Dow Corning under the trade name Silicone SYL OFF 23.

The ink-repulsive adhesive layer of the present invention joins the water-developable photopolymer layer to the ink-repulsive polysiloxane layer present on the support substrate, and desirably includes: (a) silicon rubber or oil, (b) select water-soluble resins, and (c) partially saponified polyvinyl acetate. As a consequence of the compatibility between the ink-repulsive adhesive layer and both the photopolymer and ink-repulsive layers described above, the ink-repulsive adhesive layer is preferably formulated to impart a satisfactory balance between adhesion and ink-repulsion in the developed printing plate. Thus, if too much silicon rubber or oil is included in the ink-repulsive adhesive layer, ink-repulsion characteristics are acceptable, but adhesion is poor. Similarly, if too much water soluble resin is included in the ink-repulsive layer formulation, adhesion is improved, but the ink-repulsive characteristics of the developed plate are unacceptable.

Accordingly, it has been determined that through the proper selection of components and the relative ratios of such components in the ink-repulsive adhesive layer, an acceptable balance between adhesion and ink-repulsion can be accomplished. Although partially saponified polyvinyl acetate is itself a water-soluble composition, it has been found that the use of other select water-soluble polymeric resins in combination with the partially saponified polyvinyl acetate improves the properties of the ink-repulsive adhesive layer. The use of such select water-soluble resins, for example, improves the adhesive properties of the layer over polyvinyl acetate alone, and improves the durability of the resultant printing plate, since the partially saponified polyvinyl acetate can sometimes be softened with water, even after curing, while the select water-soluble resins cannot be easily softened with water after curing.

It has been found, for example, that the following water-soluble polymeric resins are particularly well suited for use in the ink-repulsive adhesive layer: water-soluble melamines, such as methylol melamine, water-soluble polyesters, polyethylene glycol and cellulose. The water-soluble melamines are particularly preferred because they partially cross-link with the polyvinyl acetate when heating, which, in turn, provides an even more durable printing plate. The polyethylene glycol component when used has the formula HO(CH$_2$CH$_2$O)$_n$H, wherein n is between 5 and 80, and preferably between 10 and 30. The cellulose component, when used, generally has the formula:

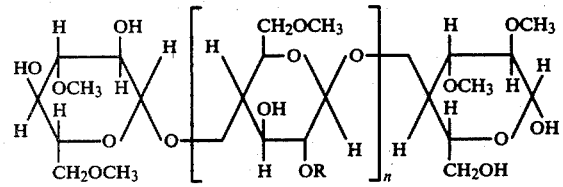

wherein R is —CH$_3$,

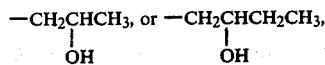

and the resultant cellulose composition has a molecular weight between 10,000 and 100,000, and preferably between 20,000 and 60,000.

Similarly, it has been determined that, when partially saponified or hydrolyzed polyvinyl acetate is employed in the photopolymer composition, partially hydrolyzed polyvinyl acetate having a preferred hydrolysis degree of about 70 to 95 percent and a polymerization degree between 300 and 2,000 is desirably used in the ink-repulsive adhesive layer composition. It has been found that the use of partially hydrolyzed polyvinyl acetate in the ink-repulsive adhesive layer not only promotes strong adhesion with the photopolymer layer, but is fully compatible with the photopolymer layer. Even when polyvinyl acetate is not used in the photopolymer layer, however, it has still been found desirable to use polyvinyl acetate in the ink-repulsive adhesive layer because the polyvinyl acetate can be easily washed with water during development of the plate thereby exposing the silicon rubber or oil layer in the undeveloped recess areas of the plate, thus improving the ink-repulsive character of those areas, while still maintaining a desirably strong adhesion in the developed relief areas of the plate.

Preferably, the ratio of water-soluble resin to silicon rubber or oil used in the ink-repulsive adhesive layer is between about 0.1 to 1 part by weight resin to each part by weight of silicon rubber or oil. As noted above, the use of too much silicon oil results in poor adhesion, while the use of too little relative to the amount of water-soluble resin used results in poor ink-repulsive properties.

Likewise, it has been found that the preferred ratio of water-soluble resins to partially hydrolyzed polyvinyl acetate used in the formulation is between about 0.1 to 2 parts by weight water-soluble resins to 1 part by weight polyvinyl acetate. The use of excessive amounts of water-soluble resins outside the preferred range can, and often does, result in the formation of an undesired gel.

The ratio of polyvinyl acetate to silicon rubber is also desirably maintained in a range from about 0.1 to 2 parts by weight polyvinyl acetate to 1 part by weight silicon rubber. Most preferably, however, the ratio by weight of polyvinyl acetate to silicon rubber is maintained between 0.25 to 0.5 on a parts by weight basis.

The relative thicknesses of the separate silicon oil ink-repulsive and ink-repulsive adhesive layers, of course, are to some extent dependent upon final characteristics designed in the developed plate. Preferably, however, the thickness of the ink-repulsive adhesive layer is maintained between 5 to 100 microns, and most preferably between 10 to 30 microns, in order to provide the desired balance of adhesion, ink-repulsion and cost. When the ink-repulsive adhesive layer is made too thick, for example, light tends to scatter from the layer during exposure and the developed plate has an undesired rough surface. Conversely, if the ink-repulsive adhesive layer is made too thin, the layer is readily eroded during operation and the developed plate has unsatisfactory durability.

The thickness of the silicon rubber layer contained in the support substrate is desirably maintained between about 2 to 30 microns, and preferably between 5 to 10 microns so that the support substrate is adequately covered, and, thus, not exposed after prolonged use of the developed plate. Through the use of two ink-repulsive layers (a first layer covering the support substrate and a second adhesive layer joining the photopolymer and first ink-repulsive layers), it has been found that the overall ink-repulsive characteristics of the developed plate are greatly enhanced. The adhesive ink-repulsive layer is generally not sufficiently thick itself to withstand severe printing environments or prolonged use, and, thus, would be rapidly eroded away, and thus expose the support substrate, were it not for the first silicon rubber ink-repulsive layer. Nonetheless, the adhesive ink-repulsive layer is both ink-repulsive and slightly water-soluble. Thus, after development, portions of the adhesive layer are washed away in the non-image areas to expose portions of the silicon rubber layer and further enhance the ink-repulsive characteristics of the developed plate. In addition, the adhesive layer itself, if desired, can be partially removed with organic solvents such as xylol or toluol to improve the ink-repulsive character of the developed plate even further.

It should, of course, be understood that in some instances a single layer of silicon rubber or oil, polyvinyl acetate and select water-soluble resins can be employed in place of the separate layers described above. In those instances, the separate silicon rubber or oil layer is eliminated, and a single layer of silicon rubber, partially saponified polyvinyl acetate and select water-soluble resins in the relative proportions set forth above is applied to the printing plate substrate. Although such single layers are less durable than a two layer structure because portions of the silicon rubber or oil tend to wash away with the polyvinyl acetate during development, they are more desirable from a cost and ease of manufacture standpoint because of the elimination of one of the two layers needed to provide both adhesive and ink-repulsive characteristics to the resultant printing plate.

Several embodiments of the present invention are illustrated in the following examples. All parts and percentages are by weight unless otherwise indicated.

EXAMPLE 1

A. Silicon SYL OFF 23 (Dow Corning) (40 parts) and S-2260 primer (Dow Corning) (5 parts) are mixed in xylene (55 parts). Half a percent of 23A catalyst (Dow Corning) based on total weight is added to this solution and the solution is stirred for 15 minutes at room temperature. The resulted solution is cast on an oil-free 10-mil thick aluminum plate and dried for 15 minutes at 120° C. to form silicone layer 20 microns in thickness.

B. The solution (10 parts) which consists of 20 parts of partially saponified polyvinyl acetate (average polymerization degree, 500; saponification degree, 82.0 mol %) and 80 parts of water, and 1.5 parts of methylated methylol melamine in water (commercial name: Resloom M-75, solid 60%, by Monsanto) are added to 75 parts of silicone solution which is prepared by dissolving 50 parts of Silicone SYL OFF 23 and half a percent of 23A catalyst based on the weight of Silicone SYL OFF 23 into 50 parts of benzene. The resulted solution is cast on the plate which is described in Method A and dried for 20 minutes at 130° C. to form second layer 5 microns in thickness.

EXAMPLE 2

The solution (15 parts) which consists of 20 parts of partially saponified polyvinyl acetate (average polymerization degree, 500; saponification degree, 82.0 mol %) and 80 parts of water, and 15 parts of 20% water solution of polyethylene glycol (molecular weight 800–1100) are added to 70 parts of silicone solution which is prepared by dissolving 50 parts of Silicone SYL OFF 23 and half a percent of 23A catalyst based on the weight of Silicone SYL OFF 23 into 50 parts of benzene. The resulted solution is cast on the plate which is described in Method A of Example 1 and dried for 20 minutes at 130° C. to form second layer 10 microns in thickness.

EXAMPLE 3

The solution (15 parts) which consists of 25 parts of partially saponified polyvinyl acetate (average polymerization degree, 500; saponification degree, 78.0 mol %) and 75 parts of water, and 10 parts of 20% water solution of polyethylene oxide polymer (commercial name Polyox WSR-N-80 by Union Carbide Corporation, approximately molecular weight of 200,000) and added to 75 parts of a silicone solution which is prepared by dissolving 50 parts of Silicone SYL OFF 23 and one percent of 23A catalyst based on the weight of Silicone SYL OFF 23 into 50 parts of xylene. The resulted solution is cast on the plate which is described in Method A of Example 1 and dried for 20 minutes at 130° C. to form second layer 5 microns in thickness.

EXAMPLE 4

A mixture of partially saponified polyvinyl acetate (average polymerization degree, 500; saponification degree, 82.0 mol %) (35 parts), water (30 parts) and Rose bengal (50 ppm of all components by weight) is kneaded in a kneader at 80 to 90 degrees centigrade for 30 minutes. Then, this mixture is cooled to 60 degrees centigrade and a mixture of diethylene glycol dimethacrylate (10 parts), B-hydroxyethyl methacrylate (24 parts), hydroquinone (0.1 percent of total monomer by weight) and benzoin isopropyl ether (1.0 part) is added and stirred for 30 minutes. The resulted photopolymerizable composition is cast on the plate which is described in Method B of Example 1. A polyester sheet is placed thereon and the resulted piled product is passed between two rolls. After cooling, the polyester sheet is peeled off and the plate is dried in a dryer at 75° C. for 20 minutes to form photosensitive layer 7 mils in thickness.

EXAMPLE 5

A mixture of partially saponified polyvinyl acetate (average polymerization degree, 500; saponification degree, 77.0 mol %) (14 parts), methylated methylol melamine (commercial name: Resloom M-75, solid 60%, by Monsanto) (6 parts), water (30 parts) and Eosin (25 ppm of all components by weight) is kneaded in a kneader at 70° C. for 25 minutes. This mixture is cooled to room temperature and a mixture B-hydroxypropyl methacrylate (20 parts), benzoin isopropylether (1 part), zinc acrylate (5 parts) and methyl alcohol (24 parts) is added and stirred for 30 minutes at room temperature. The resulted photopolymerizable composition is cast on the plate which is described in Example 2. A polyester sheet is placed thereon and the resulted piled product is passed between two rolls. After cooling, the polyester sheet is peeled off and the plate is dried in a dryer at 75° C. for 3 minutes to form photosensitive layer 5 microns in thickness.

The photopolymer plate made according to Example 4 is placed in a vacuum frame and exposed to a 3,000 watt high pressure mercury arc for 3 seconds from a distance of 20 inches. Then, a negative film is placed on the photopolymer plate and the plate is exposed to same actinic light through the negative film for 25 seconds. After exposure, the negative film is stripped from the plate and the unexposed polymer is washed away with water (temperature, 115° F.) under the pressure of 40 psi for one and a half minute. The printing plate is dried at 250° F. for one and a half minute to give a sharp relief printing plate. The resulting printing plate is mounted on a Vandercook letterpress printing machine (Universal III), and shows excellent image quality without any smutting on non-image area.

The potopolymer plate made according to Example 5 is placed in a vacuum frame and the photopolymerizable surface is brought into contact with a negative film. Then, the plate is exposed to a 3,000 watt high pressure mercury arc for 2 and a half minutes. After exposure, the unexposed polymer is removed by wiping with cotton rag using water and followed by wiping with cotton rag with hydrocarbon solvent like mineral spirit. The plate is dried at 15 degrees Fahrenheit for 1 minute. The resulting printing plate is mounted on an offset printing machine (Multilith 1250) from which water supply device has been removed, and shows excellent image quality without any smutting on non-image area.

Of course, it should be understood that various changes and modifications to the preferred embodiments described herein will be apparent to those skilled in the art. Such changes and modifications can be made without departing from the spirit and scope of the present invention and without diminishing its attendant advantages. It is, therefore, intended that such changes and modifications be covered by the following claims.

We claim:

1. A water-developable photopolymer printing plate comprising a substrate having applied thereto at least three additional layers of material disposed in a superimposed relation to one another, said layers comprising:
   (a) a first ink-repulsive layer of silicon rubber material substantially covering said substrate,
   (b) a water-developable photopolymer layer, and
   (c) a second ink-repulsive and adhesive layer joining said first ink-repulsive and said photopolymer layers, said second layer comprising a silicon rubber material, polyvinyl acetate saponified to a degree of about 65 to 99 mole percent, and a water-soluble polymeric resin selected from the group consisting of water-soluble melamines, water-soluble polyesters, polyethylene glycol and cellulose, said second layer being further characterized in that the ratio of water soluble resin to silicon rubber material is between about 0.1 to 1 part by weight resin to each part by weight silicon rubber material, the ratio of polyvinyl acetate to silicon rubber material between about 0.1 to 2 parts by weight polyvinyl acetate to 1 part by weight silicon rubber material and the ratio of water-soluble resin to polyvinyl acetate is between about 0.1 to 2 parts by weight resin to 1 part by weight polyvinyl acetate.

2. The printing plate of claim 1 wherein said silicon rubber material comprises a polysiloxane characterized by the presence of the following repeating unit in its polymeric structural chain;

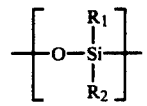

wherein $R_1$ and $R_2$ may be the same or different, and are selected from the group consisting of hydrogen, an alkyl group, halogen, phenyl and a halogenated alkyl.

3. The printing plate of claim 2 wherein the water-developable photopolymer layer comprises:
   (a) at least one unsaturated ethylenic monomer having a boiling point about 100° C., a molecular weight below 1500 and 1 to 4 polymerizable ethylenic groups, and being polymerizable by actinic light in the presence of a photopolymerization initiator;
   (b) a photopolymerization initiator; and
   (c) a partially hydrolyzed polyvinyl acetate.

4. The printing plate of claim 3 wherein the partially hydrolyzed polyvinyl acetate in said second layer has a hydrolysis degree of about 70 to 95 percent, and a molecular weight in the range of about 300 to 2000.

5. The printing plate of claim 2 wherein said photopolymer layer is a film structure comprising a generally continuous phase and a generally discontinuous phase, said continuous phase being a minor constituent of said structure and comprising a photosensitive material whose solubility with respect to a given solvent is changed upon exposure to electro-magnetic radiation, said discontinuous phase being a major constituent of said structure and comprising a particulate material which is substantially insoluble in said solvent, said phases being uniformly interdispersed throughout the entire film structure, and said film structure having a maximum thickness not greater than about ten times the average diameter of the particles comprising said major phase material.

6. A water developable printing plate comprising a substrate having applied thereto an ink-repulsive, adhesive layer joining said substrate to a water-developable photopolymer layer, said ink-repulsive adhesive layer comprising;
   (a) a polysiloxane characterized by the presence of the following repeating unit in its polymeric structural chain;

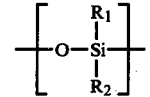

wherein $R_1$ and $R_2$ may be the same or different, and are selected from the group consisting of hydrogen, an aklyl group, halogen, phenyl and a halogenated alkyl;
   (b) partially hydrolyzed polyvinyl acetate having a hydrolysis degree of about 70 to 95 percent and a molecular weight in the range of about 300 to 2000; and
   (c) at least one water-soluble polymeric resin selected from the group consisting of water-soluble melamines, water-soluble polyesters, polyethylene glycol and cellulose wherein the ratio of water-soluble resin to polysiloxane material is between about 0.1 to 1 part by weight resin to each part by weight polysiloxane, the ratio of polyvinyl acetate to polysiloxane is between about 0.1 to 2 parts by weight polyvinyl acetate to 1 part by weight polysiloxane and the ratio of water-soluble resin to polyvinyl acetate is between about 0.1 to 2 parts by weight resin to 1 part by weight polyvinyl acetate.

7. The printing plate of claim 6 further characterized by having a first ink-repulsive layer of polysiloxane interposed between said substrate and said ink-repulsive adhesive layer.

* * * * *